United States Patent
Liao et al.

(10) Patent No.: US 7,256,464 B2
(45) Date of Patent: Aug. 14, 2007

(54) METAL OXIDE SEMICONDUCTOR TRANSISTOR AND FABRICATION METHOD THEREOF

(75) Inventors: Wen-Shiang Liao, Miaoli Hsien (TW); Wei-Tsun Shiau, Kaohsiung County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/162,080

(22) Filed: Aug. 29, 2005

(65) Prior Publication Data

US 2007/0045750 A1   Mar. 1, 2007

(51) Int. Cl.
*H01L 29/76* (2006.01)
*H01L 29/94* (2006.01)
*H01L 31/00* (2006.01)

(52) U.S. Cl. .................. 257/401; 257/412; 257/E21.64

(58) Field of Classification Search ................ 257/401, 257/412, E21.64
See application file for complete search history.

(56) References Cited

U.S. PATENT DOCUMENTS 6,900,102 B2* 5/2005 Lee et al. .................. 438/282
6,909,133 B2* 6/2005 Furukawa et al. .......... 257/296
2003/0215992 A1* 11/2003 Sohn et al. ................. 438/199
2006/0071275 A1* 4/2006 Brask et al. ................ 257/350
2006/0220148 A1* 10/2006 Furukawa et al. .......... 257/374

OTHER PUBLICATIONS

Article titled "PMOS Body-Tied FinFET (Omega MOSFET) Characteristics" jointly published by Park et al., pp. 33-34.

* cited by examiner

*Primary Examiner*—Ngân V. Ngô
(74) *Attorney, Agent, or Firm*—Jianq Chyun IP Office

(57) ABSTRACT

A metal oxide semiconductor transistor comprising a first doping type substrate, an isolation layer, a plurality of gates, a masking layer, a gate oxide layer, a plurality of second doping type source/drain regions and spacers. The first doping type substrate has a plurality of trenches patterning out a plurality of first doping type strips. The isolation layer is disposed within the trenches. The gates is disposed over the first doping type strips and oriented in a direction perpendicular to the first doping type strips. The masking layer is disposed over the first doping type substrate. The gate oxide layer is disposed between the sidewall of the first doping type strips and the gate. The second doping type source/drain regions are disposed in the first doping type strip on each side of the gate. The spacers are disposed on the sidewalls of the gates and the first doping type strips.

8 Claims, 5 Drawing Sheets

METAL OXIDE SEMICONDUCTOR TRANSISTOR AND FABRICATION METHOD THEREOF

BACKGROUND OF THE INVENTION

1. Field of the Invention

The present invention relates to an integrated circuit device and manufacturing method thereof. More particularly, the present invention relates to a metal oxide semiconductor (MOS) transistor structure and manufacturing method thereof.

2. Description of the Related Art

With the reduction of line width in metal oxide semiconductor (MOS) fabrication, leakage current in areas between the source and the drain away from the gate is increasingly significant. Although the leakage current can be reduced through a reduction in the thickness of the gate dielectric layer, it is no longer effective when the line width drops to 0.1 μm or below. To deal with this problem, Professor Chenming Hu of the University of California at Berkley has proposed two methods. The first method is to use an extremely thin first doping type semiconductor substrate to fabricate MOSFET so that the substrate no longer has an area away from the gate and hence a leakage current no longer exists. The second method is to use a double gate structure. A gate dielectric layer in the double gate structure surrounds the channel region so that the entire channel region is subjected to the influence of the gate electric field. Ultimately, the 'on' current of the device is increased and the leakage current is reduced.

A fin-type field effect transistor (FinFET) that combines the two aforementioned concepts is shown in FIGS. 1A to 1C. FIG. 1A is a top view of a conventional FinFET device. FIGS. 1B and 1C are schematic cross-sectional views along the cutting lines I–I' and II–II' in FIG. 1A. The fin-type field effect transistor is formed in the following steps. First, a silicon-on-insulator (SOI) substrate 100 is provided. The silicon layer (not shown, but is a precursor of the layer labeled 120) on the insulation layer 105 has a thickness of about 100 nm. A thermal oxidation process is carried out to trim the silicon layer into one having a thickness of about 50 nm. Thereafter, a masking layer 110 fabricated from a low-temperature oxide (LTO) material is formed over the silicon layer. After that, a 100 KeV electron beam photolithographic and anisotropic etching process is carried out to define the hard masking layer 110 and the silicon layer. Hence, a fin-like silicon layer 120 having a width between 20 nm to 50 nm is formed. The narrowness of the silicon layer 120 can be seen in FIGS. 1A through 1C. Next, a polysilicon silicon-germanium (poly Si—Ge) layer (not shown, but is a precursor of the layers labeled 140 and 150) and a hard masking layer 130 fabricated from a low-temperature oxide material are sequentially formed over the substrate 100. The poly Si—Ge layer and the hard masking layer 130 are patterned to form a raised source 140 and a drain 150 having a thickness much larger than the fin-like silicon layer 120.

Thereafter, a silicon nitride layer (not shown, but is a precursor to the layer labeled 160) is formed over the SOI substrate 100 and then an anisotropic etching operation is carried out to form spacers 160. In the anisotropic etching operation, an over-etching operation is carried out after the silicon nitride layer on the hard masking layer 130 is completely removed. Thus, the thin silicon nitride layer on the sidewalls of the fin-like silicon layer 120 is completely removed while spacers 160 are retained on the sidewalls of the raised source 140 and drain 150 as shown in FIGS. 1A and 1B. Thereafter, the sidewalls of the fin-like silicon layer 120 are oxidized to form gate oxide layers 170. Another polysilicon silicon-germanium (not shown, but is the precursor to the layer labeled 180) is formed over the SOI substrate 100 filling the gap 190 between the spacers 160. After that, the polysilicon silicon-germanium layer is patterned to form a gate 180.

In the aforementioned method of fabricating the FinFET, an electron beam photolithographic process is used to define the fin-like silicon layer 120. Hence, the fin-like silicon layer 120 can be reduced to a width between 20 nm to 50 nm to prevent a leakage current. In addition, as shown in FIGS. 1A and 1C, the two sidewalls of the fin-like silicon layer 120 are designed to sense the electric field produced by the gate 180. Hence, the device can have a larger 'on' current. However, the devices need to be formed on an expensive silicon-on-insulator substrate, thereby increasing the production cost. Besides, the FinFET fabrication process involves some quite complicated steps.

SUMMARY OF THE INVENTION

Accordingly, at least one objective of the present invention is to provide a metal oxide semiconductor (MOS) transistor structure having a lower production cost.

At least a second objective of the present invention is to provide a method of fabricating a metal oxide semiconductor (MOS) transistor that can simplify the production process.

To achieve these and other advantages and in accordance with the purpose of the invention, as embodied and broadly described herein, the invention provides a metal oxide semiconductor (MOS) transistor structure. The MOS transistor comprises a first doping type semiconductor substrate, a masking layer, an isolation layer, a plurality of gates, a gate oxide layer, a plurality of spacers and a plurality of second doping type source/drain regions. The first doping type semiconductor substrate has a plurality of trenches that patterns out a plurality of first doping type semiconductor strips. The masking layer is disposed on the first doping type semiconductor substrate. The isolation layer is disposed in the trenches such that the surface of the isolation layer is below the upper surface of the first doping type semiconductor strips. The gates are disposed over the first doping type semiconductor strips and oriented in a direction perpendicular to the first doping type semiconductor strips. The gate oxide layer is disposed between the sidewall of the first doping type semiconductor strips and the gates. The spacers are disposed on the sidewalls of the gates and the first doping type semiconductor strips. The second doping type source/drain regions are disposed in the first doping type semiconductor strips on each side of the gate.

According to the MOS transistor structure of the present embodiment, the MOS transistor further comprises a pad oxide layer disposed between the upper surface of the first doping type semiconductor strips and the masking layer.

According to the MOS transistor structure of the present embodiment, the MOS transistor further comprises a second doping type lightly doped region disposed in the first doping type semiconductor strips on each side of the gate.

According to the MOS transistor structure of the present embodiment, the MOS transistor further comprises a metal silicide layer disposed over the gates and the source/drain regions.

According to the MOS transistor structure of the present embodiment, the material constituting the isolation layer comprises silicon oxide.

According to the MOS transistor structure of the present embodiment, the MOS transistor includes an n-type metal oxide semiconductor (n-MOS) transistor and a p-type metal oxide semiconductor (p-MOS) transistor.

According to the MOS transistor structure of the present embodiment, the first doping type material is a p-doped material and the second doping type material is an n-doped material.

According to the MOS transistor structure of the present embodiment, the first doping type material is an n-doped material and the second doping material type is a p-doped material.

The present invention also provides a method of fabricating a metal oxide semiconductor (MOS) transistor comprising the following steps. First, a first doping type semiconductor substrate is provided. A masking layer is formed over the first doping type semiconductor substrate. Thereafter, a patterned photoresist layer is formed over the masking layer. Using the patterned photoresist layer as a mask, the first doping type semiconductor substrate and the masking layer are patterned to form a plurality of trenches that partitions the first doping type semiconductor substrate into a plurality of first doping type semiconductor strips. After that, an isolation layer is formed inside the trenches such that the surface of the isolation layer is below the upper surface of the first doping type semiconductor strips. Next, a gate oxide layer is formed on the sidewalls of the first doping type semiconductor strips. A plurality of gates is formed over the first doping type semiconductor substrate. The gates cover the masking layer above the first doping type semiconductor strips and the isolation layer inside the trenches. Furthermore, the gates are set in a direction perpendicular to the first doping type semiconductor strips. Thereafter, a plurality of spacers is formed on the sidewalls of the gates and the first doping type semiconductor strips. Finally, a plurality of second doping type source/drain regions is formed in the first doping type semiconductor strips on each side of the gates.

According to the method of fabricating a MOS transistor of the present embodiment, the method further comprises forming a plurality of second doping type lightly doped regions in the first doping type semiconductor strips on each side of the gates.

According to the method of fabricating a MOS transistor of the present embodiment, the method further comprises forming a metal silicide layer over the gates and the source/drain regions.

According to the method of fabricating a MOS transistor of the present embodiment, the process of forming the isolation layer includes the following steps. First, an insulating material layer is formed over the first doping type semiconductor substrate to fill the trenches totally and cover the masking layer. Thereafter, a planarization is performed using the masking layer as a polishing stop layer. Finally, using the masking layer as a mask, the insulating material layer is etched to form the isolation layer.

According to the method of fabricating a MOS transistor of the present embodiment, the material constituting the isolation layer comprises silicon oxide.

According to the method of fabricating a MOS transistor of the present embodiment, the MOS transistor comprises an n-type metal oxide semiconductor (n-MOS) transistor and a p-type metal oxide semiconductor (p-MOS) transistor.

According to the method of fabricating a MOS transistor of the present embodiment, the first doping type material is a p-doped material and the second doping type material is an n-doped material.

According to the method of fabricating a MOS transistor of the present embodiment, the first doping type material is an n-doped material and the second doping type material is a p-doped material.

The MOS transistor of the present invention has a low production cost due to its special structural design. Moreover, the MOS transistor device has a larger channel area permitting an increase in driving voltage and a reduction in short-channel effect. Furthermore, the method of fabricating the MOS transistor simplifies the process flow and provides an effective means of isolating neighboring MOS transistor devices.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
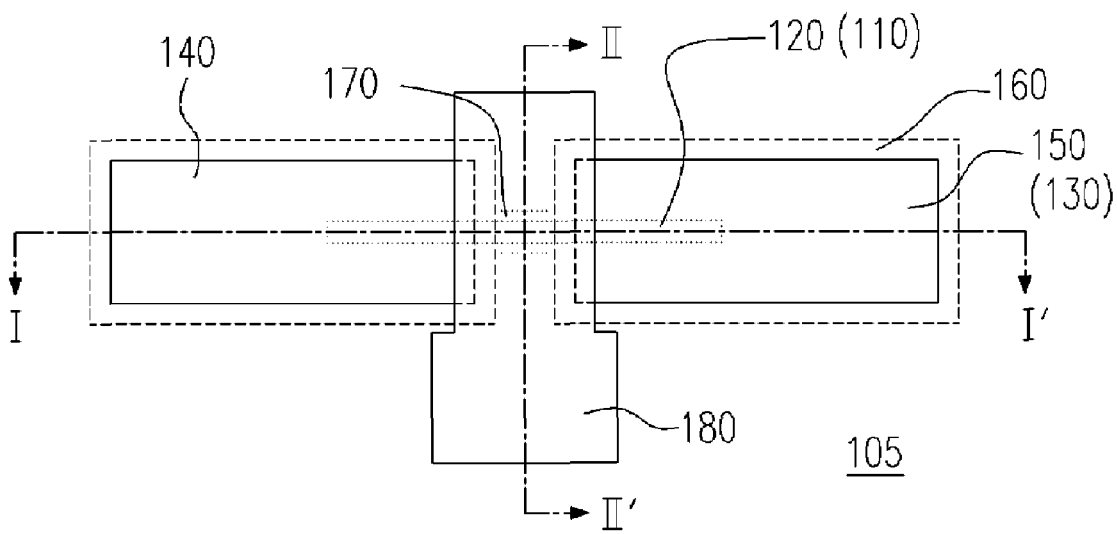
FIG. 1A is a top view of a conventional FinFET device.
Figure 1B:
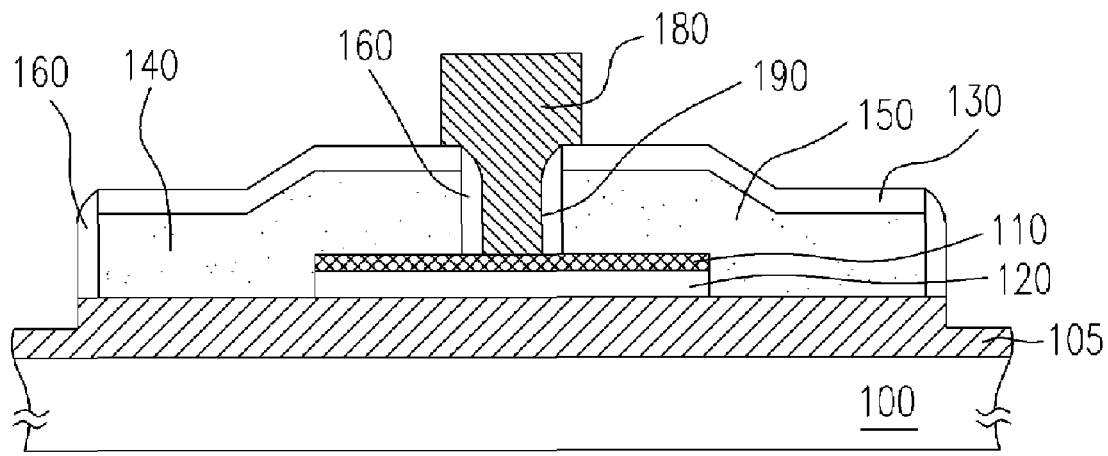
FIGS. 1B and 1C are schematic cross-sectional views along the cutting lines I–I' and II–II' in FIG. 1A.
Figure 1C:
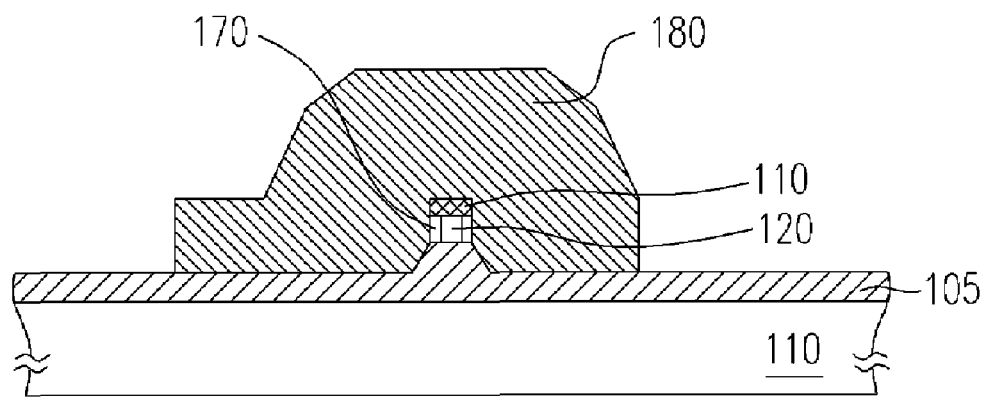

Reference will now be made in detail to the present preferred embodiments of the invention, examples of which are illustrated in the accompanying drawings. Wherever possible, the same reference numbers are used in the drawings and the description to refer to the same or like parts.

Figure 2:
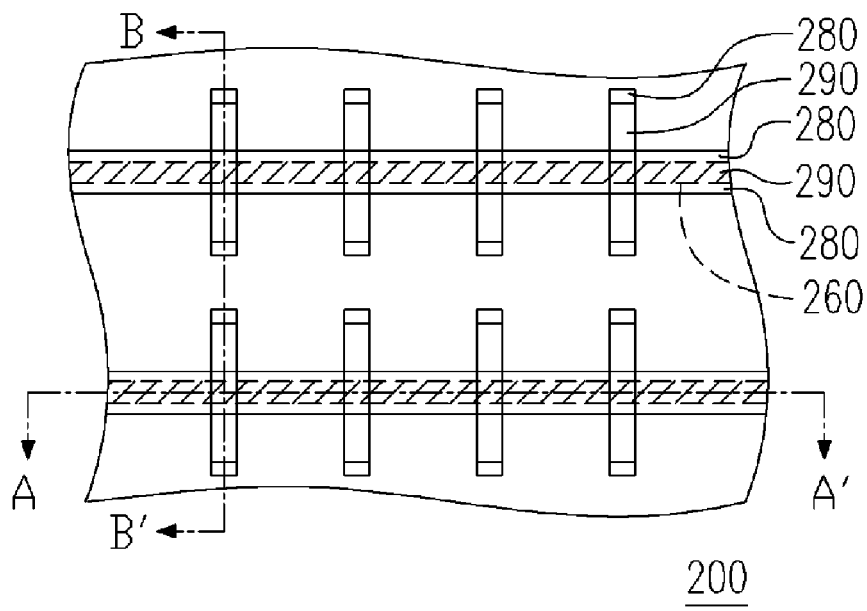
FIG. 2 is a top view of a MOS transistor according to one preferred embodiment of the present invention.
Figure 3:
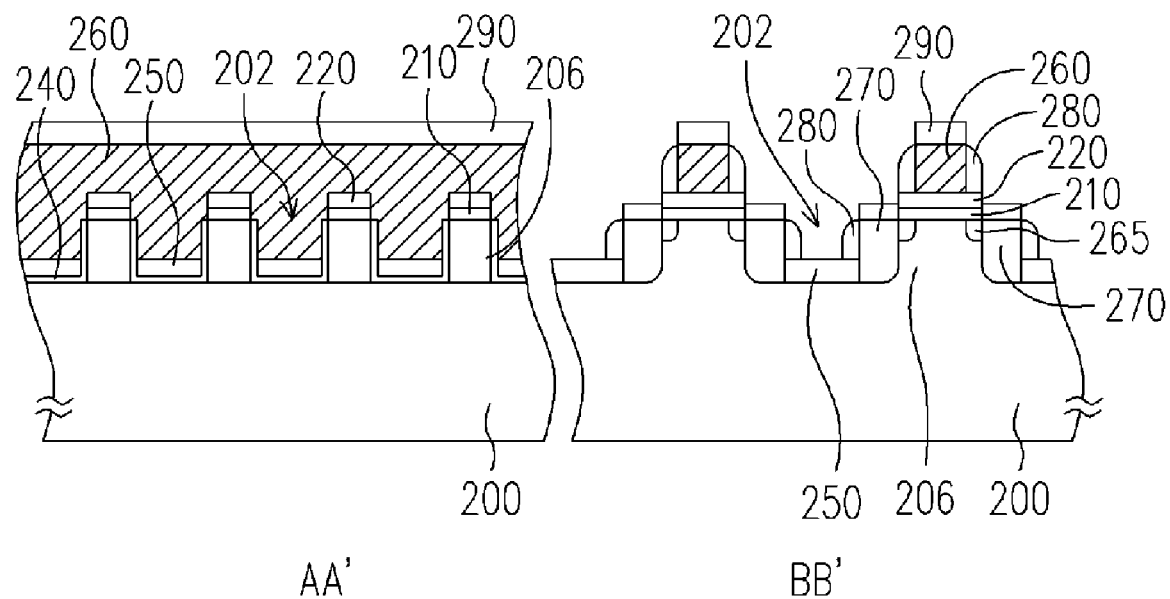
FIGS. 3 is a diagram showing the cross-sectional views along the respective cutting lines A–A' and B–B' in FIG. 2.

FIG. 2 is a top view of a MOS transistor according to one preferred embodiment of the present invention. FIG. 3 is a diagram showing the cross-sectional views along the respective cutting lines A–A' and B–B' in FIG. 2. As shown in FIG. 3, the present invention provides a metal oxide semiconductor (MOS) transistor structure. The MOS transistor mainly comprises a first doping type semiconductor substrate 200, a pad oxide layer 210, a masking layer 220, a gate oxide layer 240, an isolation layer 250, a plurality of gates 260, a plurality of second doping type source/drain regions 270, a plurality of spacers 280 and a metal silicide layer 290. The first doping type semiconductor substrate 200 is a silicon substrate having a plurality of trenches 202 thereon. The trenches 202 have an average depth of about 4000 Å and partition the first doping type semiconductor substrate 200 into a plurality of first doping type semiconductor strips 206. The first doping type material is a p-doped material, for example.

The isolation layer 250 is disposed inside the trenches 202 for isolating two neighboring MOS transistor devices. The surface of the isolation layer 250 is below the upper surface of the first doping type semiconductor strips 206 so that the subsequently formed gate 260 over the first doping type semiconductor strips 206 has a larger channel contact area. The isolation layer 250 having a thickness of about 3000 Å is fabricated from silicon oxide, for example.

As shown in FIG. 2, the gates 260 is formed over the first doping type semiconductor strips 206 and is oriented in a direction perpendicular to the first doping type semiconductor strips 206. The gate is fabricated from doped polysilicon, for example.

As shown in FIG. 3, the masking layer 220 is disposed on the first doping type semiconductor strips 206. The masking layer 220 has a thickness of about 1500 Å and is fabricated from silicon nitride, for example. The masking layer 220 mainly serves as a mask in an etching operation and a polishing stop layer in a planarization operation. In the present embodiment, the masking layer 220 is a single-layered masking layer. However, the masking layer 220 can be a composite multi-layered stack.

The pad oxide layer 210 is disposed between the upper surface of the first doping type semiconductor strips 206 and the masking layer 220. The pad oxide layer 210 has a thickness of about 100 Å and serves to increase the adhesive strength between the masking layer 220 and the first doping type semiconductor substrate 200. The gate oxide layer 240 is disposed between the sidewalls of the first doping strips 206 and the gates 260. The gate oxide layer is fabricated from silicon oxide, for example.

As shown in FIG. 3, the second doping type lightly doped regions 265 are disposed in the first doping type semiconductor strips 206 on each side of the gates 260. The second doping type material is an n-doped material, for example. The spacers 280 are disposed on the sidewalls of the gates 260 and the first doping type strip 206. The spacers 280 are fabricated from silicon nitride, for example. The second doping type source/drain regions 270 are disposed in the first doping type semiconductor strips 206 on each side of the gates 260. The second doping type material is an n-doped material, for example.

As shown in FIG. 3, the metal silicide layer 290 is disposed over the gates 260 and the source/drain regions 270 of the MOS transistor structure for reducing electrical resistance and increasing conductivity. Preferably, the metal silicide layer 290 is a cobalt silicon layer.

The aforementioned MOS transistor structure not only reduces overall production cost, but also increases the size of the channel area so that short-channel effect is effectively reduced. Furthermore, the trenches 202 and the isolation layer 250 in the structure form an effective barrier against conduction between neighboring MOS transistor devices.

Figure 4:
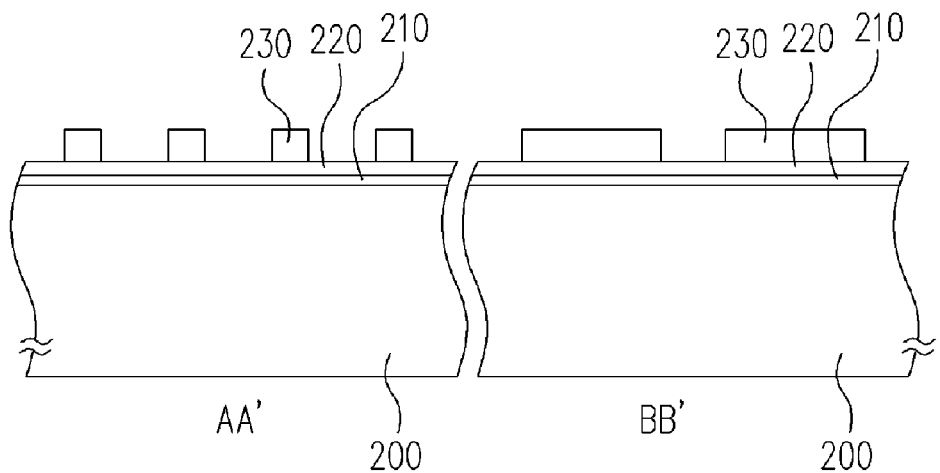
FIGS. 4 through 11 are diagrams along the cross-sectional views along the lines A–A' and B–B' in FIG. 2 showing the steps for fabricating a MOS transistor according to one preferred embodiment of the present invention.

FIGS. 4 through 11 are diagrams along the cross-sectional views along the lines A–A' and B–B' in FIG. 2 showing the steps for fabricating a MOS transistor according to one preferred embodiment of the present invention. As shown in FIG. 4, a first doping type semiconductor substrate 200 is provided. The first doping type is a boron-doped or p-doped material layer, for example. Thereafter, a pad oxide layer 210 is formed over the first doping type semiconductor substrate 200 for increasing the adhesive strength of the subsequently formed masking layer 220. The pad oxide layer 210 is a silicon oxide layer formed, for example, by performing a thermal oxidation operation. After that, the masking layer 220 is formed over the pad oxide layer 210. The masking layer is a silicon nitride layer formed, for example, in a low-pressure chemical vapor deposition (LPCVD) process. A patterned photoresist layer 230 is formed over the masking layer 220. It should be noted that the masking layer 220 in the present invention has a single-layer structure. However, the masking layer 220 in other embodiments may use a multi-layered structure having a silicon nitride layer and a silicon oxide layer alternately stacked over each other.

Figure 5:
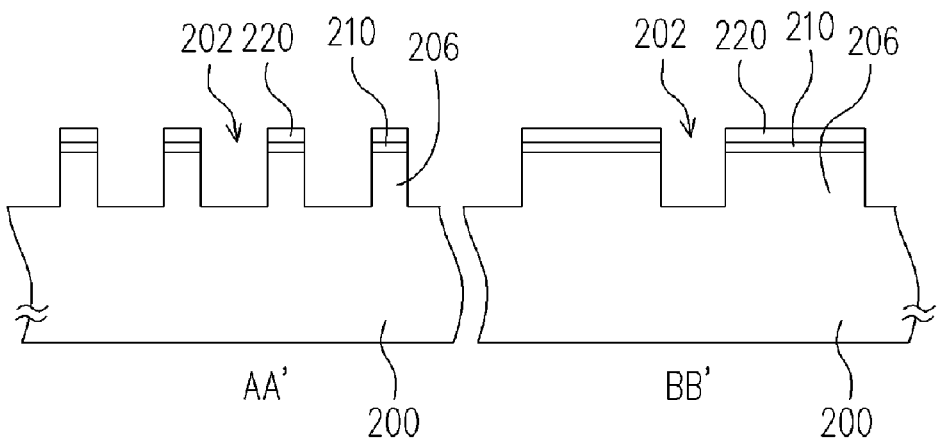

As shown in FIG. 5, using the patterned photoresist layer 230 as a masking, the masking layer 220, the pad oxide layer 210 and the first doping type semiconductor substrate 200 are etched to form a plurality of trenches 202 and a plurality of first doping type semiconductor strips 206 in the first doping type semiconductor substrate 200. The method of patterning the first doping type semiconductor substrate 200 includes performing a reactive ion etching (RIE) process, for example. After that, the patterned photoresist layer 230 is removed.

Figure 6:
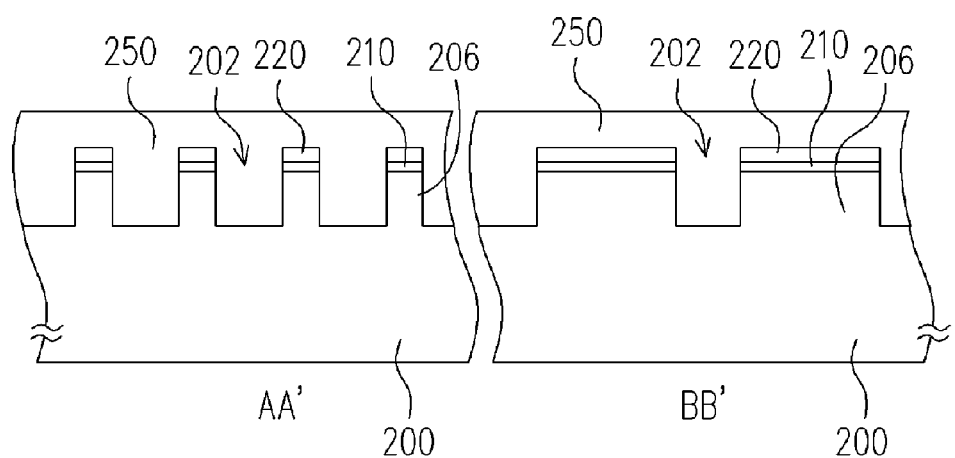

As shown in FIG. 6, an isolation layer 250 is formed over the first doping type semiconductor substrate 202 to fill the trenches 202 totally and cover the masking layer 220. The isolation layer 250 is formed, for example, by performing a low-pressure chemical vapor deposition (LPCVD) process. The isolation layer 250 is fabricated using silicon oxide, for example.

Figure 7:
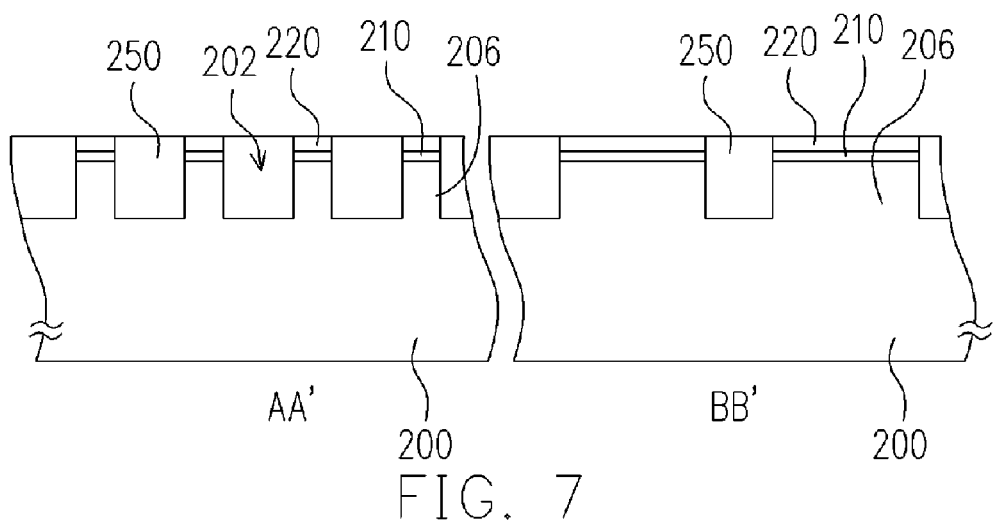

As shown in FIG. 7, the isolation layer 250 is planarized using the masking layer 220 as a polishing stop layer in a chemical-mechanical polishing (CMP) operation, for example.

Figure 8:
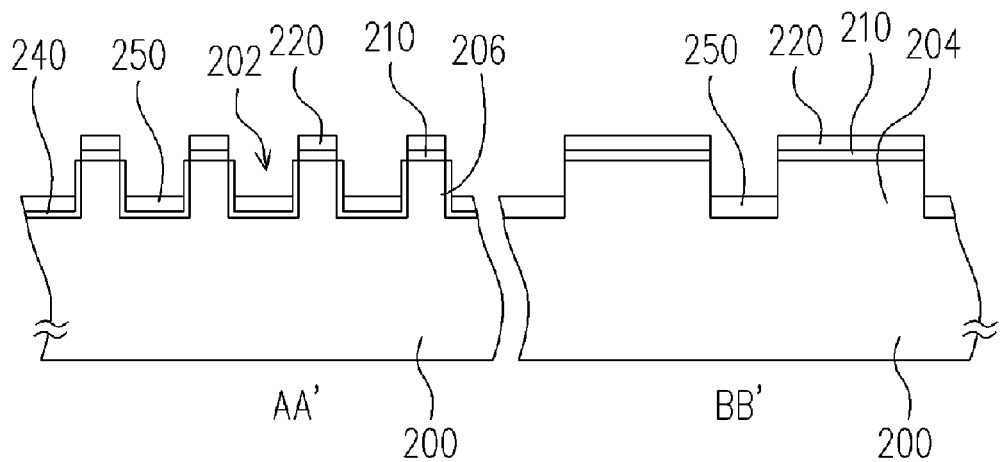

As shown in FIG. 8, using the masking layer 220 as a hard mask, the isolation layer 250 is etched so that the surface of the isolation layer 250 is below the upper surface of the first doping type semiconductor strips 206. The isolation layer 250 can be etched, for example, by performing a reactive ion etching (RIE) process. Using the masking layer 220 serves as a hard mask as well as a polishing stop layer in the planarization process simplifies MOS transistor fabrication process. Thereafter, a gate oxide layer 240 is formed on the sidewalls of the first doping type semiconductor strips 206. The gate oxide layer 240 is a silicon oxide layer formed, for example, by performing a thermal oxidation. After that, the first doping type semiconductor strips 204 are doped to adjust the threshold voltage value. The doping process is an ion implant operation, for example.

Figure 9:
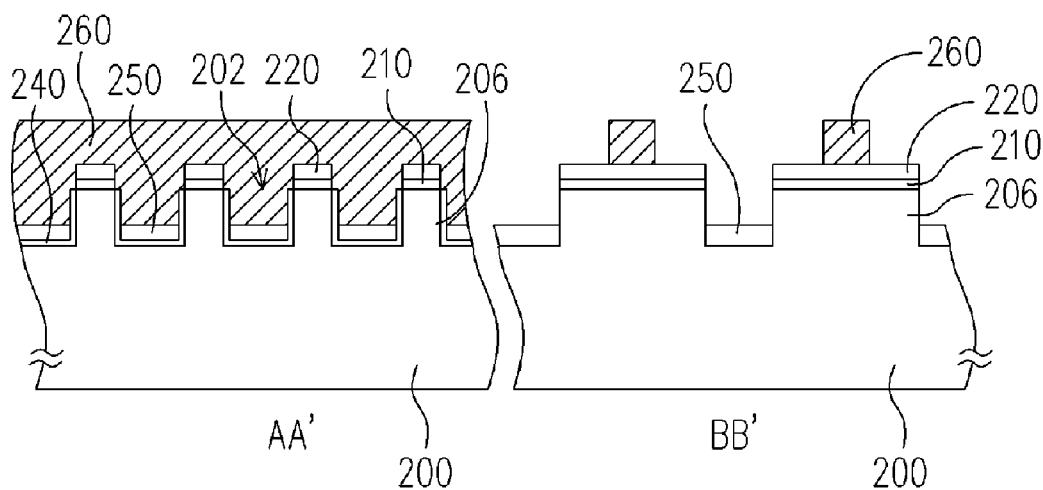

As shown in FIGS. 9 and 2, a conductive layer (not shown) is formed over the first doping type semiconductor substrate 200. The conductive layer is patterned to form a plurality of gates 260. The gates 260 cover the masking layer 220 above the first doping type semiconductor strips 206 and the isolation layer 250 inside the trenches 202. Furthermore, the gates 260 are oriented in a direction perpendicular to the first doping type semiconductor strips 206.

Figure 10:
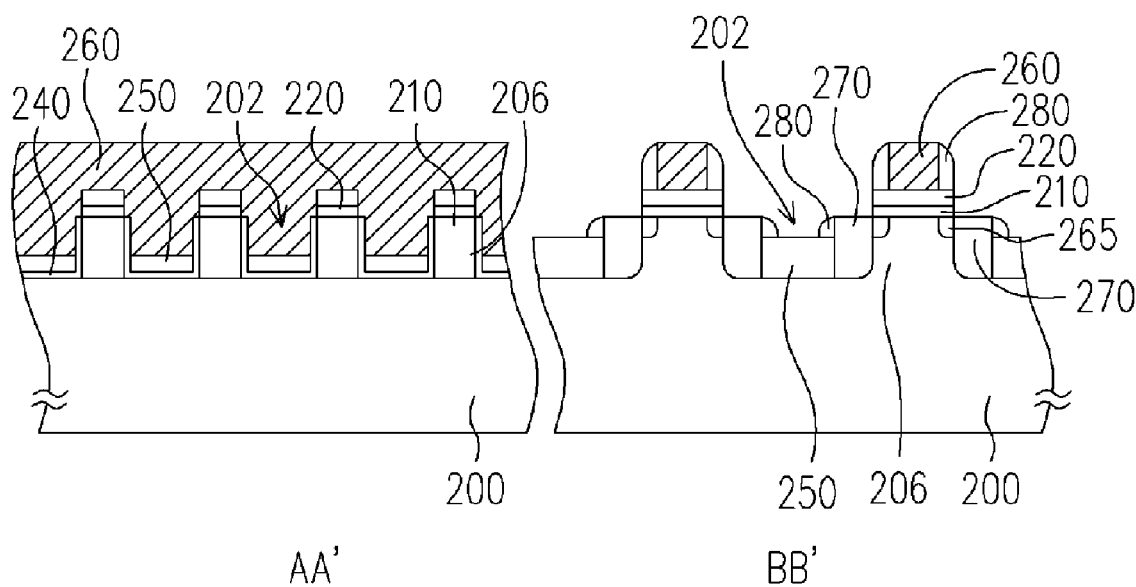

As shown in FIG. 10, a light doping of the two sides of the first doping type semiconductor strips 206 underneath the gates 260 is carried out to form a plurality of second doping type lightly doped regions 265. The doping process for forming the second doping type lightly doped regions 265 includes an ion implantation. The second doping type is an n-doped material formed by doping phosphorus ions, for example. Thereafter, a plurality of spacers 280 is formed on the sidewalls of the gates 260 and the first doping type semiconductor strips 206 and a portion of the pad oxide layer 210 and the masking layer 220 are removed. The method of forming the spacers 280 includes depositing material over the substrate 200 in a chemical vapor deposition (CVD) to form a protective layer (not shown) and then performing an anisotropic etching process such as a reactive ion etching (RIE) to remove a portion of the protective layer. After that, the two sides of the first doping type semiconductor strips 206 underneath the gates 260 are heavily doped to form a plurality of second doping type source/drain regions 270. The doping process for forming the second doping type source/drain region 270 is an ion implantation, for example. The second doping type is an n-doped material formed by doping phosphorus ions, for example.

Figure 11:
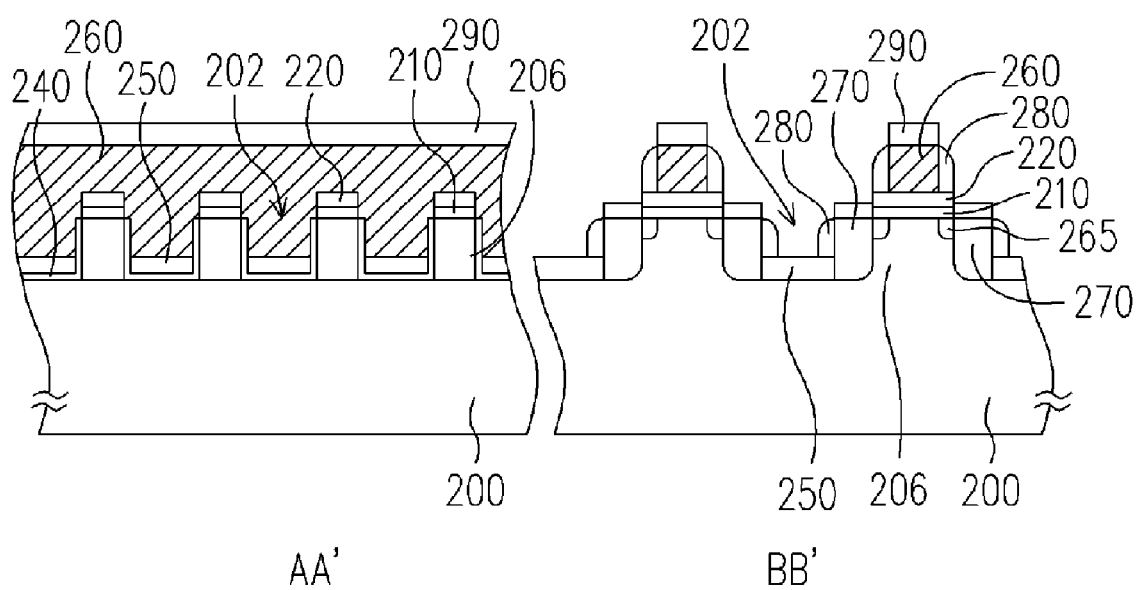

As shown in FIG. 11, a metal silicide layer 290 is formed over the gates 260 and the source/drain regions 270 of the MOS transistor structure. The metal silicide layer 290 is formed, for example, by performing a chemical vapor deposition (CVD) process.

The aforementioned embodiment of the present invention describes the fabrication of an n-type MOS transistor with the first doping type being a p-type and the second doping type being an n-type. However, the present invention can be applied to fabricate a p-type MOS transistor. In this case, the first doping type is an n-type and the second doping type is a p-type.

In general, a complimentary metal oxide semiconductor (CMOS) transistor comprising a p-type MOS (PMOS) transistor and an n-type MOS (NMOS) transistor can be formed on a substrate as shown in FIG. 11. Since the method of fabricating a CMOS transistor is similar to the process of fabricating a conventional CMOS, detailed description is omitted.

The aforementioned method of fabricating a MOS transistor not only simplifies the production process, but also provides an effective means of isolating various MOS transistor structures through the trenches 202 and the insulating layer 250.

In summary, major advantages of the MOS transistor structure and manufacturing method of the present invention includes the followings.

1. Without deploying a silicon-on-insulator (SOI) substrate, the production cost of the MOS transistor can be reduced.

2. Because the contact area between the gate and the channel region is increased, a relatively large channel area is produced. Hence, short channel effect is minimized.

3. The method of fabricating the MOS transistor according to the present invention simplifies the steps for forming semiconductor devices.

4. The MOS transistor structure and manufacturing method thereof according to the present invention also provides an effective means of isolating neighboring MOS transistor devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A metal oxide semiconductor (MOS) transistor structure, comprising:
   a first doping type semiconductor substrate having a plurality of trenches that partition the first doping type semiconductor substrate into a plurality of first doping type semiconductor strips;
a masking layer disposed on the first doping type semiconductor substrate;
   an isolation layer disposed in the trenches, wherein the surface of the isolation layer is below the upper surface of the first doping type semiconductor strips;
   a plurality of gates disposed over the first doping type semiconductor strips and set in a direction perpendicular to the first doping type semiconductor strips;
   a gate oxide layer disposed between the sidewalls of the first doping type semiconductor strips and the gates;
   a plurality of spacers disposed on the sidewalls of the gates and the first doping type semiconductor strips; and
   a plurality of second doping type source/drain regions disposed in the first doping type semiconductor strips on each side of the gates.

2. The MOS transistor structure of claim 1, wherein the structure further comprises a pad oxide layer disposed between the upper surface of the first doping type semiconductor strips and masking layer.

3. The MOS transistor structure of claim 1, wherein the structure further comprises a second doping type lightly doped region disposed in the first doping type semiconductor strips on each side of the gates.

4. The MOS transistor structure of claim 1, wherein the structure further comprises a silicide layer disposed on the gates and the source/drain regions.

5. The MOS transistor structure of claim 1, wherein the material constituting the isolation layer comprises silicon oxide.

6. The MOS transistor structure of claim 1, wherein structure further comprises an n-type MOS transistor and a p-type MOS transistor.

7. The MOS transistor structure of claim 1, wherein the first doping type material is a p-type material and the second doping type material is an n-type material.

8. The MOS transistor structure of claim 1, wherein the first doping type material is an n-type material and the second doping type material is a p-type material.

* * * * *